United States Patent
Kawadahara

(10) Patent No.: US 11,646,239 B2
(45) Date of Patent: May 9, 2023

(54) REGISTRATION MARK, POSITIONAL DEVIATION DETECTION METHOD AND DEVICE, AND METHOD FOR MANUFACTURING SEMICONDUCTOR DEVICE

(71) Applicant: Kioxia Corporation, Tokyo (JP)

(72) Inventor: Sho Kawadahara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/405,413

(22) Filed: Aug. 18, 2021

(65) Prior Publication Data
US 2022/0293478 A1    Sep. 15, 2022

(30) Foreign Application Priority Data

Mar. 10, 2021 (JP) .............................. JP2021-038418

(51) Int. Cl.
| | | |
|---|---|---|
| H01L 21/66 | (2006.01) | |
| H01L 21/3065 | (2006.01) | |
| H01L 21/308 | (2006.01) | |
| G03F 7/20 | (2006.01) | |
| G01B 9/02017 | (2022.01) | |

(52) U.S. Cl.
CPC .......... H01L 22/20 (2013.01); G01B 9/02019 (2013.01); G03F 7/70775 (2013.01); H01L 21/308 (2013.01); H01L 21/3065 (2013.01)

(58) Field of Classification Search
None
See application file for complete search history.

(56) References Cited

U.S. PATENT DOCUMENTS

| | | | | |
|---|---|---|---|---|
| 4,327,292 | A * | 4/1982 | Wang .................. | H01J 37/3045 250/398 |
| 5,898,478 | A * | 4/1999 | Yim .......................... | G03F 1/44 430/22 |
| 9,983,485 | B2 | 5/2018 | Bogaart | |
| 2003/0211700 | A1* | 11/2003 | Leung .................. | G03F 7/70683 430/30 |
| 2016/0078626 | A1* | 3/2016 | Kodama ................ | H01L 21/681 382/149 |
| 2017/0351173 | A1* | 12/2017 | Funabashi ............. | G03F 9/7084 |

FOREIGN PATENT DOCUMENTS

| | | |
|---|---|---|
| JP | 3991241 B2 | 10/2007 |
| JP | 2017-215556 A | 12/2017 |
| JP | 6595517 B2 | 10/2019 |

* cited by examiner

*Primary Examiner* — Stephanie P Duclair
(74) *Attorney, Agent, or Firm* — Oblon, McClelland, Maier & Neustadt, L.L.P.

(57) ABSTRACT

According to one embodiment, a registration mark includes a first step portion and a second step portion. The first step portion includes a plurality of first steps which descend step by step in a first direction from a surface of a substrate or a layer formed on the substrate. The second step portion includes a plurality of second steps which descend step by step from the surface in a second direction different from the first direction and have the same number as the number of the plurality of first steps, is spaced apart from the first step portion, and is disposed rotationally symmetrically to the first step portion.

8 Claims, 11 Drawing Sheets

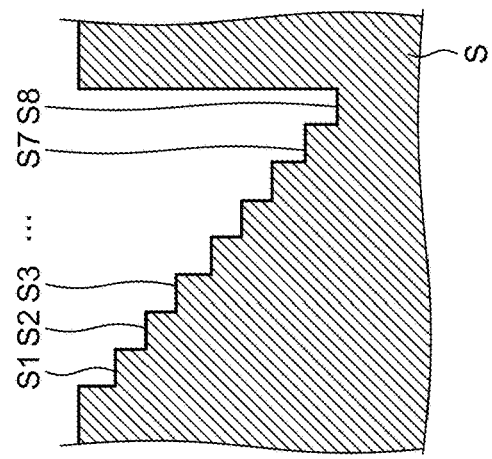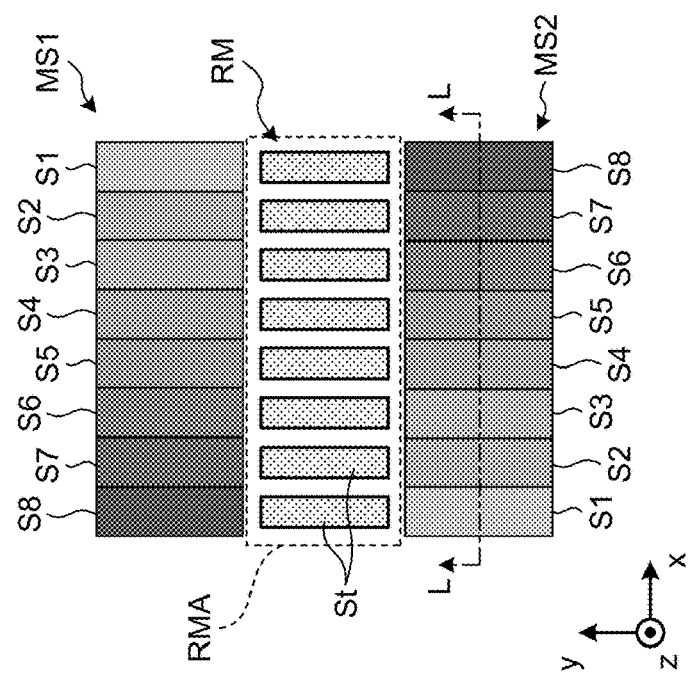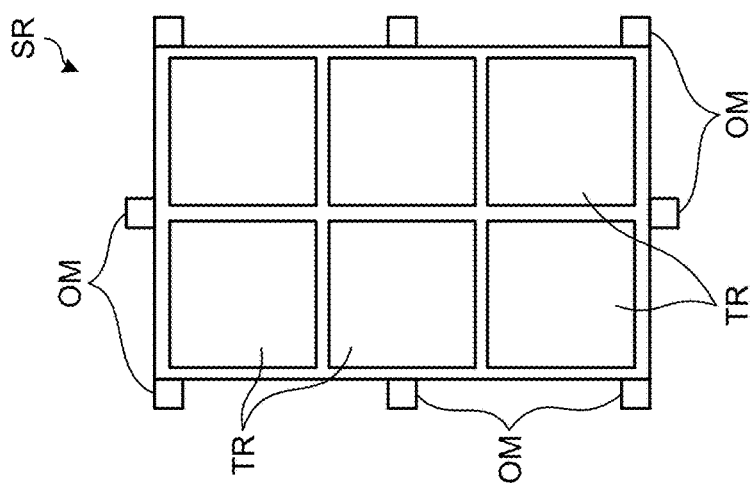

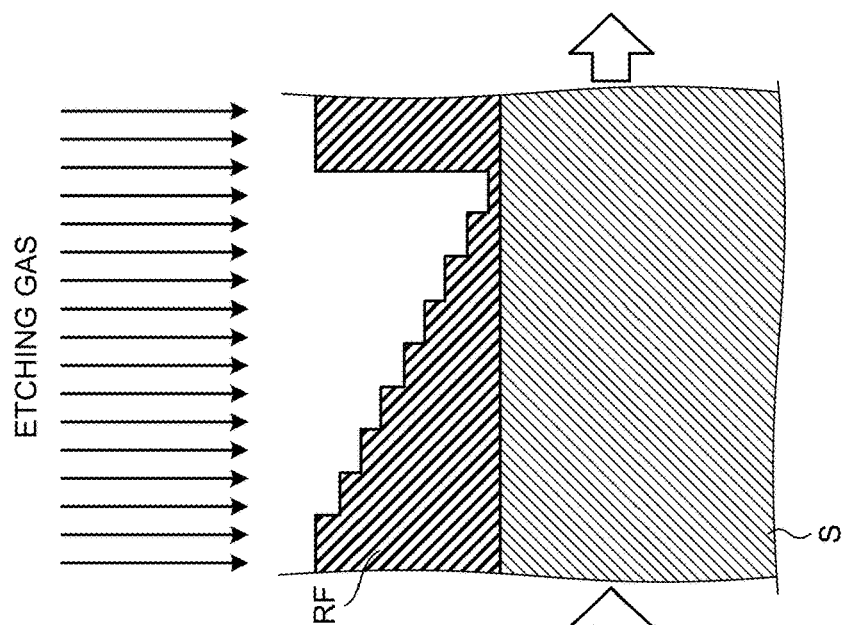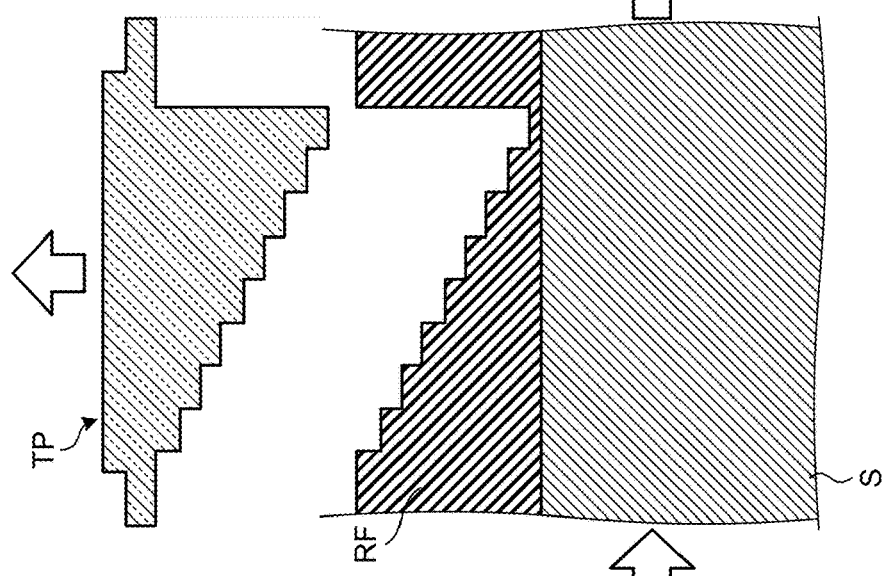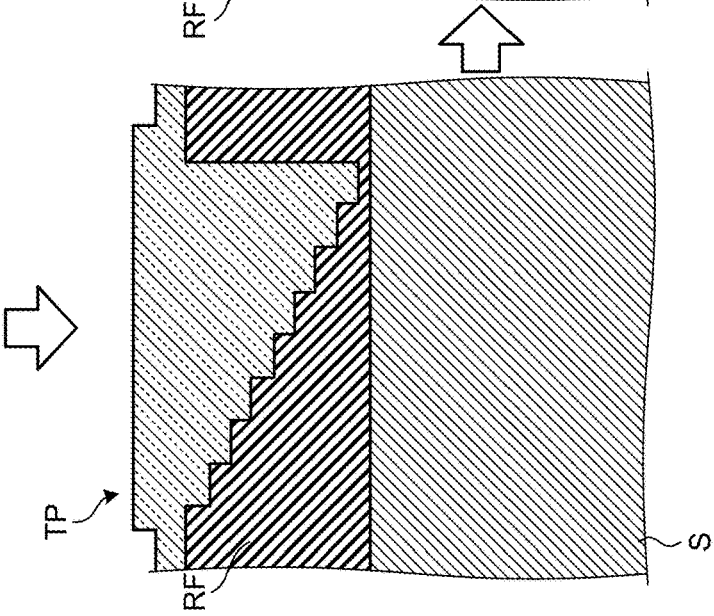

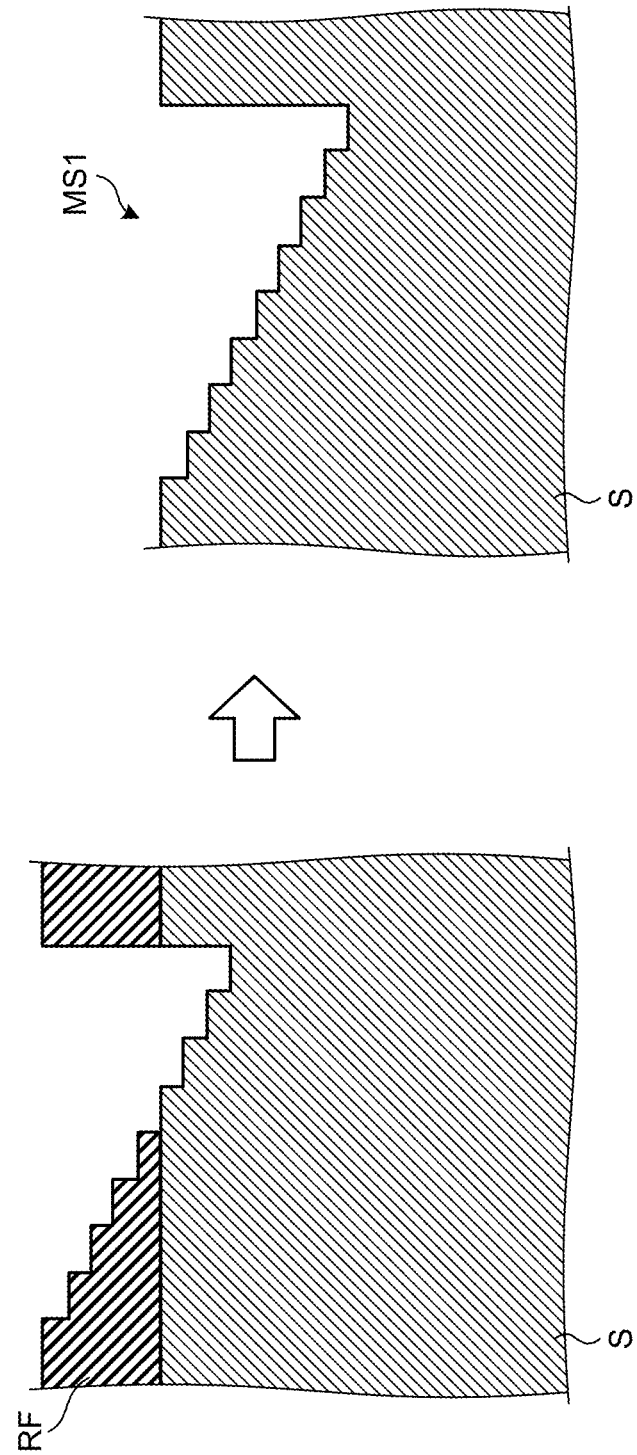

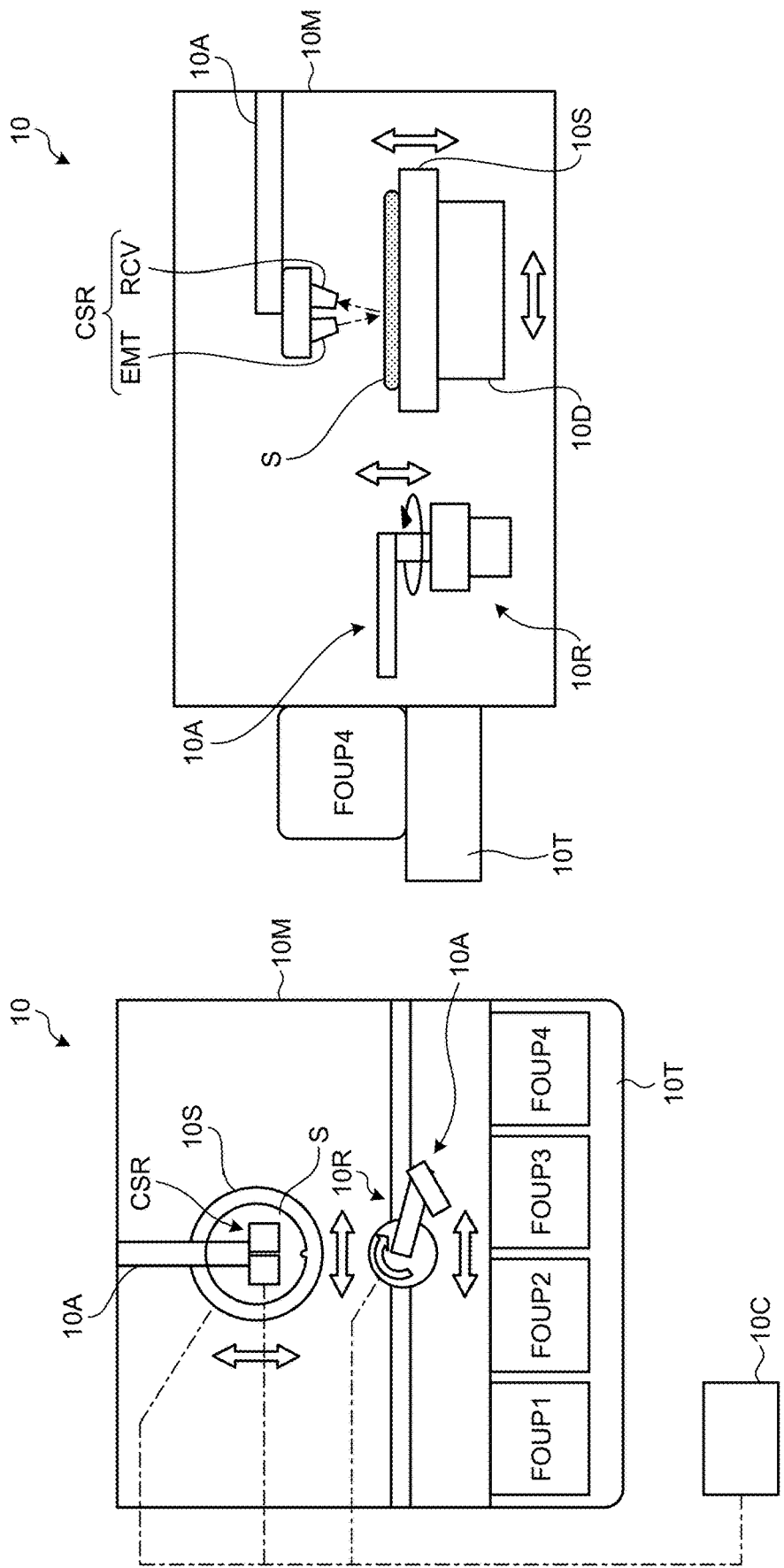

REGISTRATION MARK, POSITIONAL DEVIATION DETECTION METHOD AND DEVICE, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-038418, filed on Mar. 10, 2021; the entire contents of which are incorporated herein by reference.

FIELD

Embodiments described herein relate generally to a registration mark, a positional deviation detection method and device, and a method for manufacturing a semiconductor device.

BACKGROUND

For example, in a semiconductor device such as a semiconductor memory, a three-dimensional structure is adopted for high-density integration. Therefore, on a semiconductor substrate such as a silicon wafer, several layers are stacked while being registered with one another, and it is important that two layers vertically adjacent to each other are positionally aligned with each other with accuracy. Registration marks are used for such a highly accurate positional alignment; however, in some cases, the registration marks themselves may be affected by a plurality of processes to be performed during a period of forming one layer, and it may be difficult to detect the registration marks with accuracy.

BRIEF DESCRIPTION OF THE DRAWINGS

FIGS. 1A to 1C are schematic diagrams for explaining registration marks according to the present embodiment;

FIGS. 8A to 8C are cross-sectional views schematically illustrating a method for forming registration marks according to the present embodiment;

FIGS. 9A and 9B are cross-sectional views schematically illustrating the method for forming registration marks according to the present embodiment;

FIGS. 10A and 10B are schematic diagrams illustrating a registration device according to a second embodiment.

DETAILED DESCRIPTION

Figure 2:
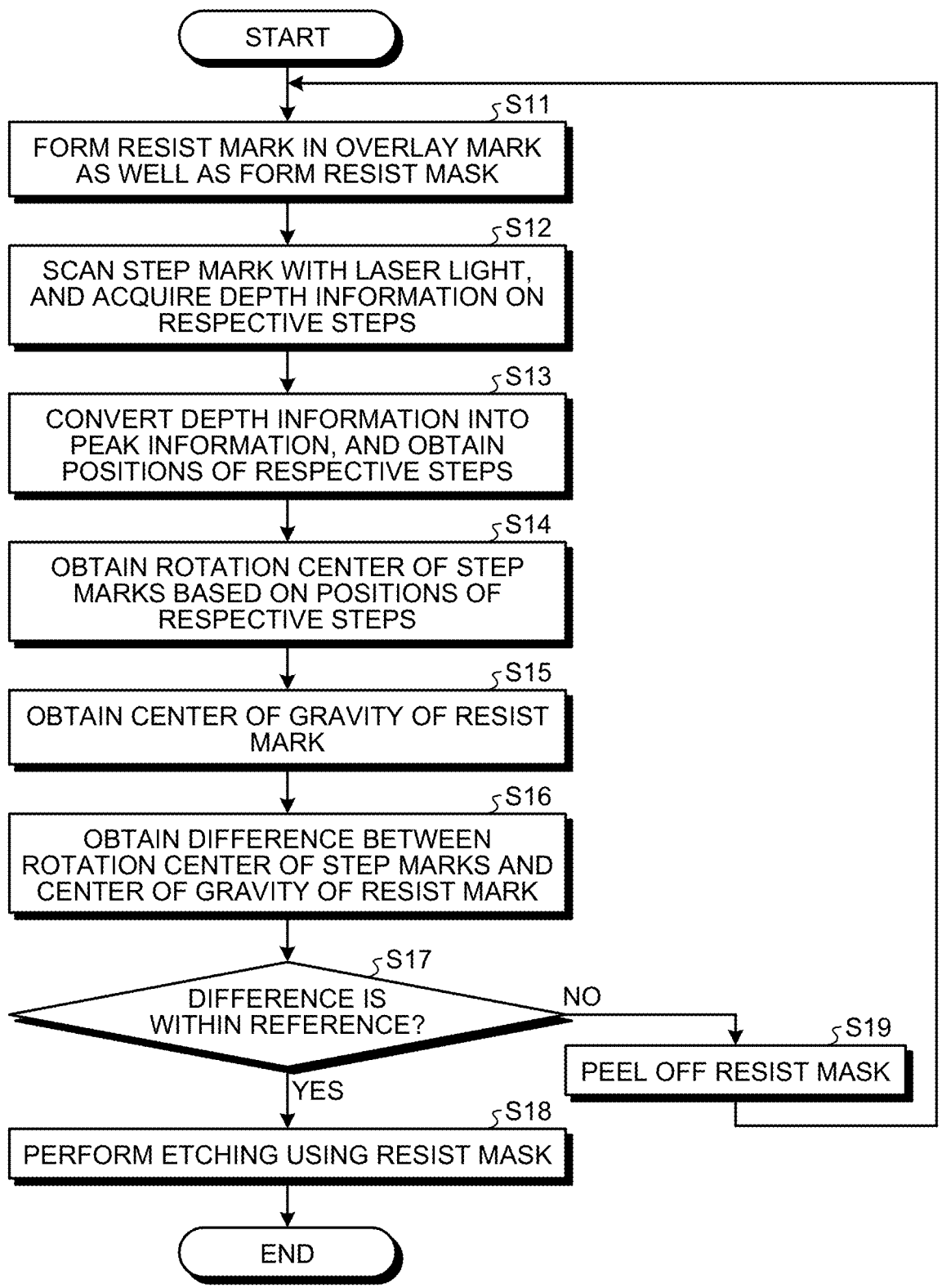
FIG. 2 is a flowchart explaining a method for manufacturing a semiconductor device according to the present embodiment.

In general, according to one embodiment, a registration mark includes a first step portion and a second step portion. The first step portion includes a plurality of first steps which descend step by step in a first direction from a surface of a substrate or of a layer formed on the substrate. The second step portion includes a plurality of second steps which descend step by step from the surface in a second direction different from the first direction and have a same number as a number of the plurality of first steps, is spaced apart from the first step portion, and is disposed rotationally symmetrically to the first step portion.

A description will be given below of non-limitative and illustrative embodiments of the present invention with reference to the drawings. In all the accompanying drawings, the same or corresponding reference numerals are assigned to the same or corresponding members or components, and a duplicate description will be omitted. Moreover, the drawings do not aim at illustrating relative ratios between members or components or between thicknesses of a variety of layers, and hence, specific thicknesses and dimensions may be determined by those skilled in the art by referring to the following non-limitative embodiments.

First Embodiment

First, referring to FIGS. 1A to 1C to FIGS. 5A and 5B, a description will be given of registration marks according to a first embodiment and a method for manufacturing a semiconductor device, the method using the same. FIGS. 1A to 1C are schematic diagrams for explaining the registration marks according to the present embodiment, and FIG. 2 is a flowchart explaining the method for manufacturing a semiconductor device according to the present embodiment. FIGS. 3A and 3B to FIGS. 5A and 5B are schematic diagrams for explaining a principle of steps to be performs by such a manufacturing method.

FIG. 1A is a top view schematically illustrating a shot region. As illustrated, the shot region SR can include, for example, six semiconductor chip regions TR. Moreover, in the illustrated example, around the shot region SR, for example, on a scribe line (also referred to as a kerf region), eight overlay marks OM (hereinafter, simply referred to as marks OM) are arranged. These marks OM are provided in order to detect positional deviations between layers of a semiconductor device to be formed on a semiconductor substrate.

In the present embodiment, as illustrated in FIGS. 1B and 1C, each of the marks OM includes two-line step marks (step portions) MS1 and MS2 which extend in an x-axis direction on a surface layer of a substrate S and are arranged to be spaced apart from each other in a y-axis direction. As illustrated in FIG. 1C, the step mark MS1 includes eight steps S1 to S8 which descend step by step from a surface of the substrate S along a positive direction of an x-axis in the drawing. Meanwhile, the step mark MS2 includes eight steps S1 to S8 which descend step by step from the surface of the substrate S along a negative direction of the x-axis. That is, the steps S1 to S8 of the step marks MS1 and MS2 descend in directions opposite to each other along the x-axis.

Moreover, the step marks MS1 and MS2 are spaced apart from each other in the y-axis direction. Hence, the step marks MS1 and MS2 will be arranged to be rotationally symmetrically (specifically, point-symmetrically) to each other about an arbitrary point in a region RMA. Note that, in FIG. 1B, for the sake of convenience, a deeper step among the steps S1 to S8 is represented by darker gray.

Moreover, though depending on the semiconductor device to be manufactured, a width (a length in the x-axis direction) of each of the steps S1 to S8 in the step marks MS1 and MS2 may be, for example, 1 µm to 2 µm, and a height (a length in the y-axis direction) thereof may be, for example, approximately 50 nm. The mark OM may have a rectangular shape in which a length of a side is, for example, 25 µm to 35 µm.

Further, in the present embodiment, the region RMA is provided between the step marks MS1 and MS2, and a resist mark RM may be formed here. The resist mark RM may be formed of a photoresist on the region RMA, and can include a plurality of stripes St, which individually extend in the y-axis direction and are arrayed on the x-axis. The resist mark RM is formed together with a photoresist mask for layers which will be formed on the substrate S from now on, and the step marks MS1 and MS2 are formed at the time forming a lower layer among the layers. That is, the resist mark RM is not present when the lower layer is formed, and is formed when a layer on the lower layer is formed.

Figure 3B:
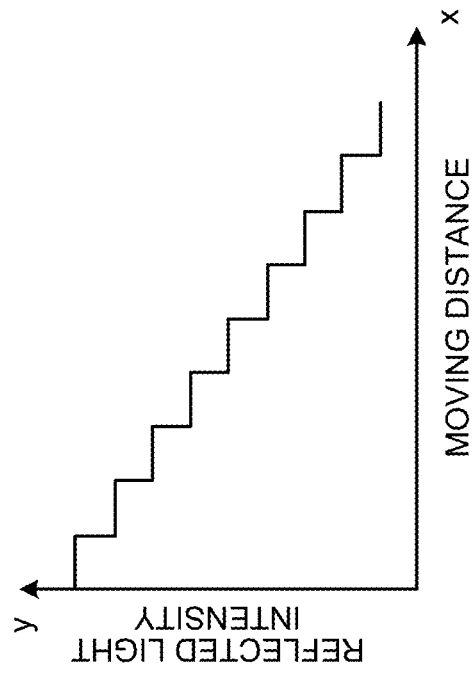
FIGS. 3A and 3B are schematic diagrams for explaining a principle of steps to be performed in the method for manufacturing a semiconductor device according to the present embodiment.
Figure 3A:
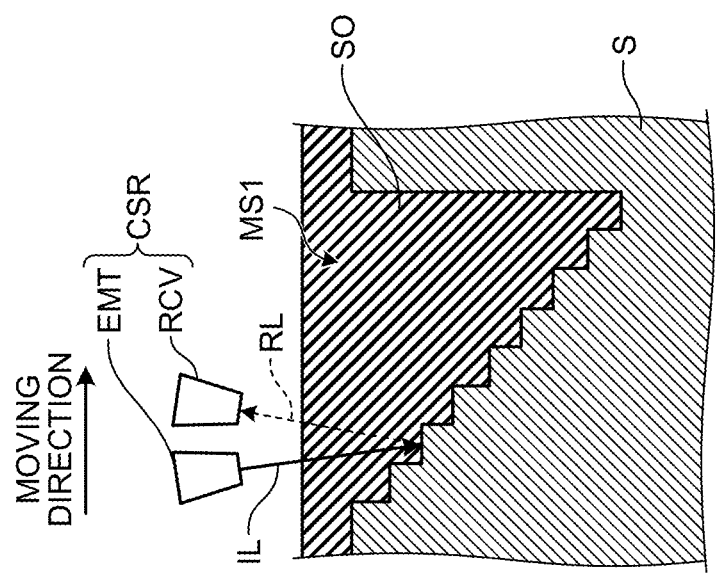
Figure 4B:
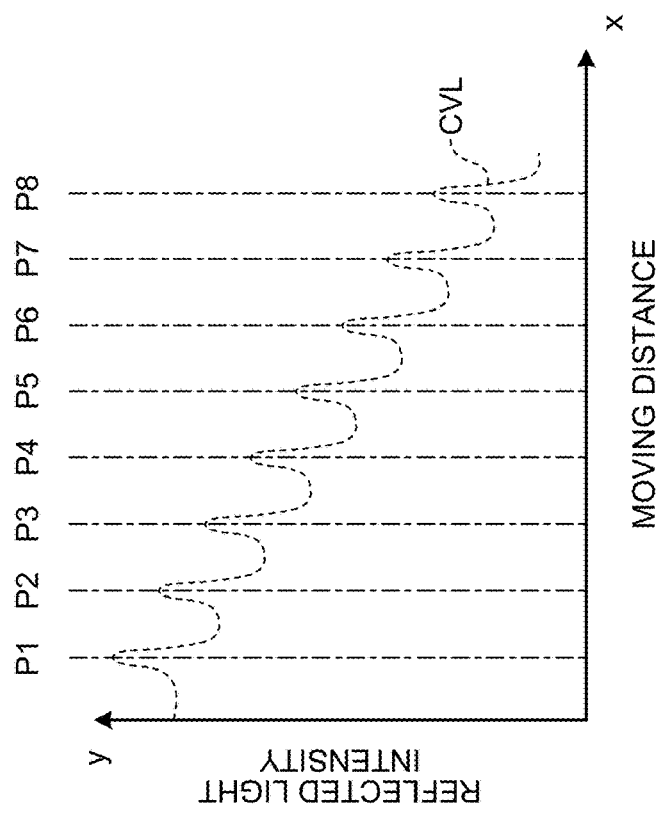
FIGS. 4A and 4B are schematic diagrams for explaining the principle of the steps to be performed in the method for manufacturing a semiconductor device according to the present embodiment.
Figure 4A:
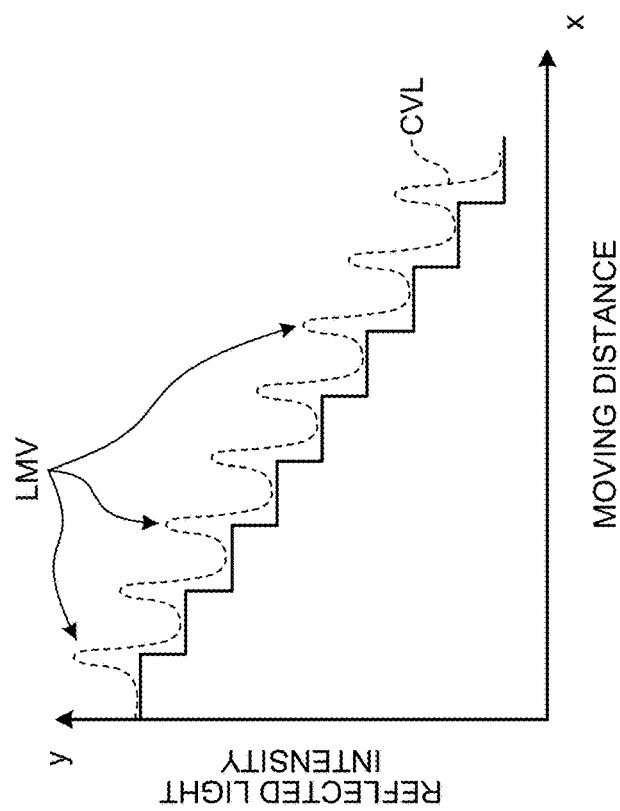
Figure 5A:
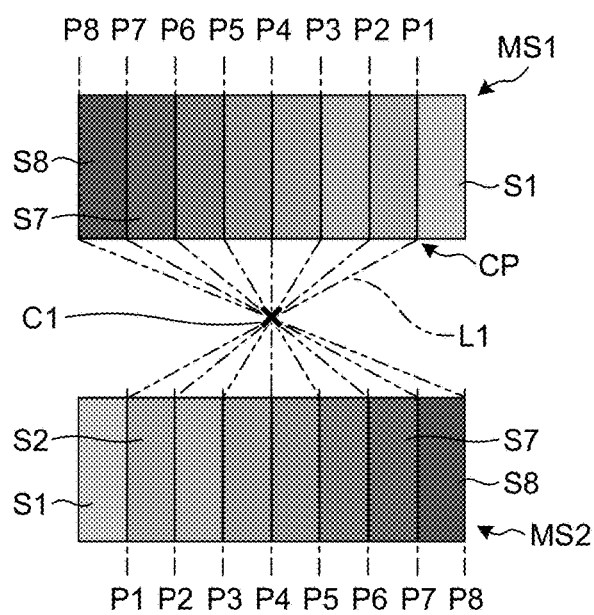
FIGS. 5A and 5B are schematic diagrams for explaining the principle of the steps to be performed in the method for manufacturing a semiconductor device according to the present embodiment.
Figure 5B:
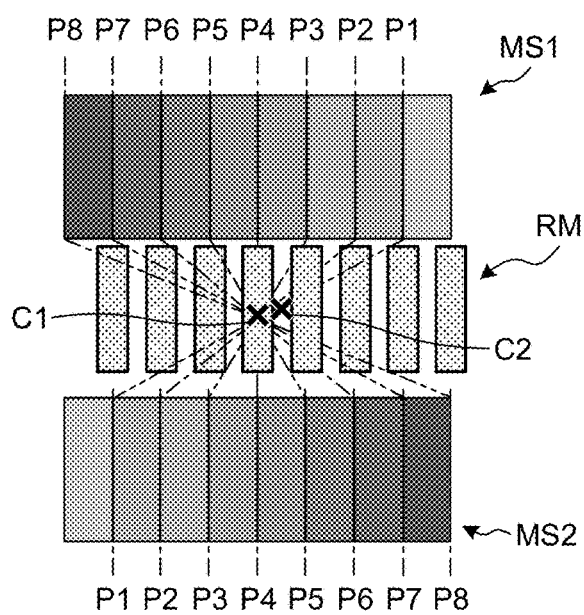

Next, referring to FIG. 2 to FIGS. 5A and 5B, a description will be given of the method for manufacturing a semiconductor device, the method using the marks OM according to the present embodiment. FIG. 2 is a flowchart explaining the manufacturing method according to the present embodiment. FIGS. 3A and 3B are schematic diagrams explaining laser light scanning for the mark OM, which is to be performed in this manufacturing method, FIGS. 4A and 4B are schematic diagrams explaining signals obtained by the laser light scanning and processing thereof, and FIGS. 5A and 5B are schematic diagrams explaining a positional deviation determination to be performed in this manufacturing method. In the following description, it is assumed that, first, the lower layer is formed after the mark OM is formed, and a silicon oxide film SO is exposed on an outermost surface. That is, the step marks MS1 and MS2 of the mark OM are embedded in the silicon oxide film SO.

First, in Step S11, a photoresist film is formed on the substrate S on which the lower layer is formed, the photoresist film is patterned, and an etching mask (not illustrated) for a layer that will be formed from now on is formed. The etching mask may be formed by exposing the photoresist film by using a photomask (a reticle). Alternatively, the etching mask may be formed by patterning the photoresist film by using a nano-imprint template. When the etching mask is formed, the resist mark RM is also formed in the resist mark region RMA of the mark OM. Note that, when an antireflection film is formed as an underlayer of the photoresist film before the photoresist film is formed, it is desirable that the antireflection film or the like be removed after the etching mask and the resist mark RM are formed.

Next, depth information of the step marks MS1 and MS2 of the mark OM is acquired. Specifically, in Step S12, as illustrated in FIG. 3A, first, the step mark MS1 of the mark OM is scanned with laser light. Specifically, as illustrated, laser light IL is emitted from an emitting unit EMT of a sensor CSR toward the step mark MS1, and reflected light RL from a point irradiated with the laser light IL is received by a light receiving unit RCV. When the sensor CSR moves along the step mark MS1, the steps S1 to S8 are sequentially irradiated with the laser light IL, and the reflected light RL is detected from each of the steps S1 to S8.

Herein, as the steps S1 to S8 go deeper, absorption amounts of the laser light IL and the reflected light RL by the silicon oxide film SO increase, and accordingly, an intensity of the reflected light RL decreases. Hence, as illustrated in FIG. 3B, in a graph representing a relationship between irradiated positions with the laser light IL and a received light intensity of the reflected light RL, the received light intensity of the reflected light RL decreases step by step with respect to a horizontal axis (in accordance with a moving distance of the sensor CSR). Such a step-by-step decrease reflects depths of the respective steps S1 to S8 of the step mark MS1 of the mark OM, and hence, the depth information of the step mark MS1 is acquired. Subsequently, the step mark MS2 is scanned with the laser light, and depth information of the step mark MS2 is acquired in the same way.

Next, in Step S13, positions of the steps S1 to S8 of the step mark MS1 are detected on the basis of the depth information acquired in Step S12. That is, as illustrated in FIG. 4A, when the intensities of the reflected light RL are differentiated with respect to the x-axis, differential values change rapidly, and maximum values LMV appear. Positions of these maximum values LMV correspond to edges of the respective steps S1 to S8. Thus, as illustrated in FIG. 4B, positions P1 to P8 of the respective edges of the steps S1 to S8 are detected. Such detection (in Step S13) is performed also for the step mark MS2, and positions of edges of the steps S1 to S8 of the step mark MS2 are detected.

Subsequently, in Step S14, a rotation center of the step marks MS1 and MS2 is obtained on the basis of the positions P1 to P8 of the edges of the respective steps S1 to S8 of the step mark MS1, the positions being obtained in Step S13. Specifically, as illustrated in FIG. 5A, for example, an intersection point CP of a side in the step mark MS1, the side facing the step mark MS2, and the position P1 of the edge of the step S1 and a similar intersection point of a side in the step mark MS2, the side facing the step mark MS1, and the position P1 of the edge of the step S1 are connected to each other by a segment L1. This is performed also for the remaining steps of the step marks MS1 and MS2, and a point C1 where these segments intersect one another is obtained. This point corresponds to the rotation center of the step mark MS1 and the step mark MS2 (hereinafter, this rotation center will be referred to as a rotation center C1).

Note that the rotation center may be obtained on the basis of a curve CVL illustrated in FIG. 4A. Specifically, for each of the step marks MS1 and MS2, the whole of a coordinate system (an x-axis, a y-axis) of the curve CVL is rotated by 180° at an arbitrary point, and then in the case where the curves CVL of both overlap each other, a point concerned is obtained as a rotation center. Moreover, in place of the curve CVL, a (staircase-like) reflected light intensity curve (for example, see FIGS. 3B, 4A, and 4B) may be used.

Subsequently, a center of gravity C2 of the resist mark RM is obtained in Step S15. Next, in Step S16, a difference (a deviation) between the rotation center C1 of the step marks MS1 and MS2 and the center of gravity of the resist mark RM is obtained. Subsequently, in Step S17, it is determined whether the difference falls within a range of reference. When it is determined that the difference falls within the range of reference (Step S17: Yes), etching using the etching mask formed in Step S11 is performed. Meanwhile, when it is determined that the difference does not fall within the range of reference (Step S17: No), the resist mask is peeled off, and in Step S11, another etching mask is formed. Thereafter, the steps on and after the above-mentioned Step S12 are repeated until it is determined in Step S17 that the difference falls with the range of reference. When it is determined that the difference falls within the range of reference (Step S17: Yes), etching using that etching mask is performed, and the method for manufacturing a semiconductor device according to the present embodiment is ended. Note that this manufacturing method includes a positional deviation detection method between layers in the semiconductor device. That is, the above-mentioned Steps S11 to S17 can be implemented as such a positional deviation detection method.

Figure 6A:
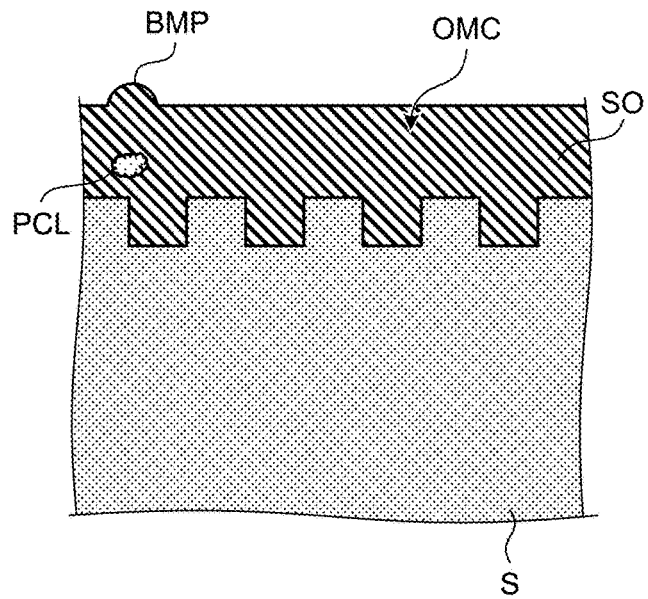
FIGS. 6A to 6D are schematic diagrams for explaining registration marks according to a comparative example.
Figure 6C:
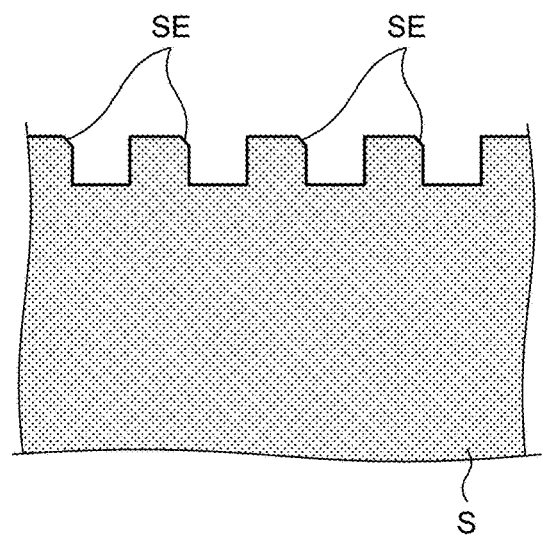
Figure 6B:
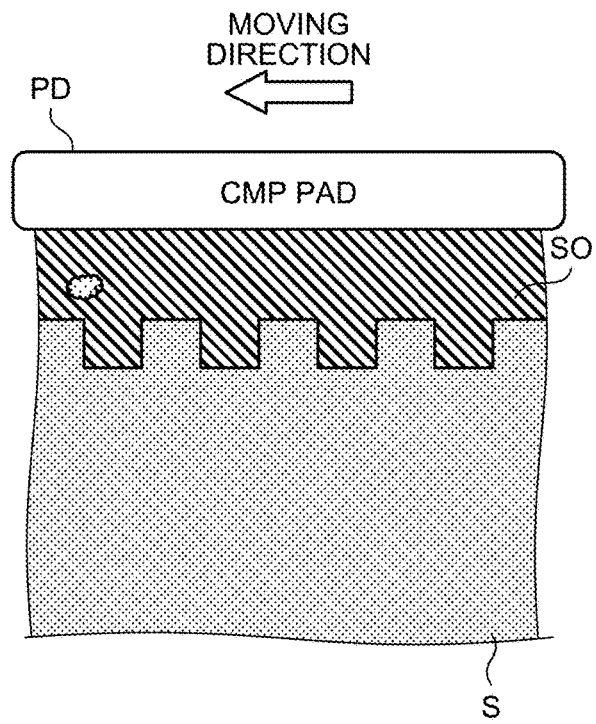

Next, while referring to a comparative example, a description will be given of effects of the marks OM according to the present embodiment and the method for manufacturing a semiconductor device, the method using the same. FIGS. 6A to 6D are cross-sectional views schematically illustrating an overlay mark OMC (referred to as a mark OMC) according to the comparative example. As illustrated, unlike such a mark OM according to the present embodiment, in the mark OMC according to the comparative example, four recesses having substantially the same depth are formed periodically. Depending on the semiconductor device to be fabricated, for example, in some cases, after the mark OMC is formed on the substrate S as an underlayer, for example, a thin film SO containing silicon oxide is deposited on the underlayer. At this time, for example, as illustrated in FIG. 6A, it can occur that a particle PCL adheres to the thin film SO during deposition and is taken into the thin film SO. In this case, as the deposition of the thin film SO progresses, in some cases, a shape thereof is reflected, and for example, a protruding defect BMP may occur on the surface of the thin film SO. It is apprehended that such a defect BMP may adversely affect subsequent processes, for example, such as a photolithography process. Therefore, after the thin film SO is deposited, the defect BMP is removed in some cases by planarizing the surface of the thin film SO by using a chemical mechanical polishing (CMP) method as illustrated in FIG. 6B.

Figure 6D:
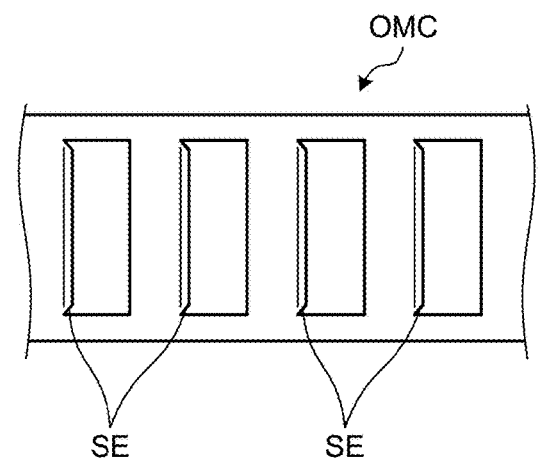

Herein, in the case of the mark OMC in the comparative example, when an amount of polishing by the planarization increases accidentally, corners of upper ends of the mark OMC are scraped in some cases. Specifically, corner portions which are opposed to a moving direction of a pad of a CMP device are particularly prone to be scraped, and as illustrated in FIG. 6C, inclined surfaces SE are generated on the corner portions in some cases. The mark OMC is detected by being imaged from above, for example, by an imaging element. Accordingly, when the inclined surfaces SE are generated, it is apprehended that boundaries between the respective recesses of the mark OMC may be ambiguous as illustrated in FIG. 6D. Therefore, it is possible that it may become difficult to detect the mark OMC with accuracy.

Figure 7A:
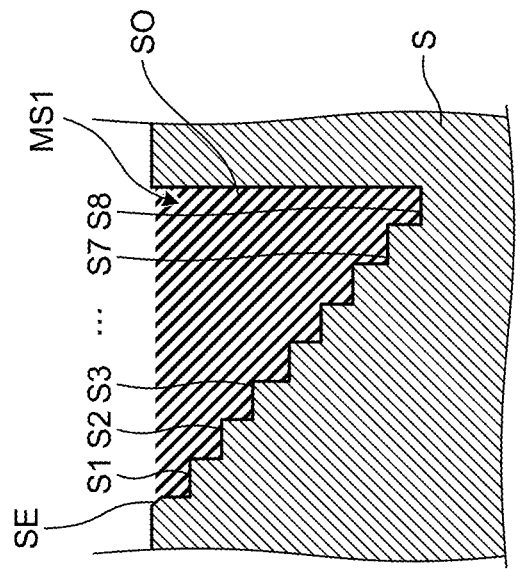
FIGS. 7A and 7B are schematic diagrams for explaining an effect of the registration marks according to the present embodiment.
Figure 7B:
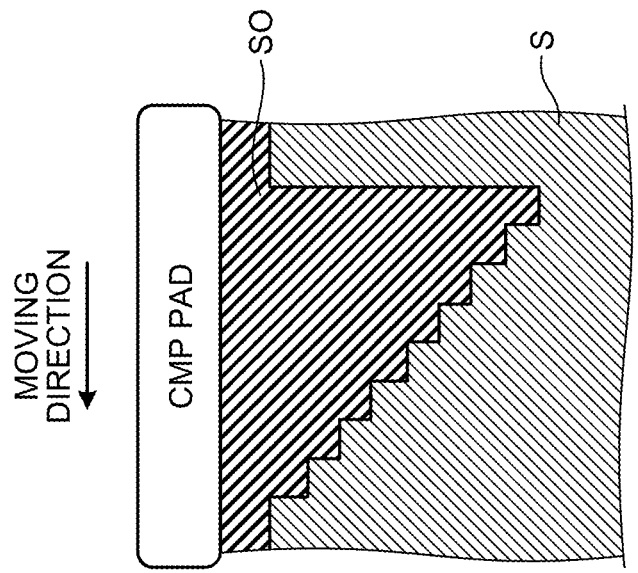

In contrast, the mark OM according to the present embodiment includes the step marks MS1 and MS2. These include the respective steps S1 to S8 which are formed on the underlayer and descend step by step in the directions opposite to each other. In this case, even if the thin film SO is planarized as illustrated in FIG. 7A, and upper ends thereof are scraped and such an inclined surface SE is generated as illustrated in FIG. 7B, the steps S1 to S8 located at portions deeper than this are hardly scraped. That is, the inclined surfaces are hardly generated on the edges of the respective steps S1 to S8. Then, by the sensor CSR, the respective steps S1 to S8 are scanned with the laser light, and the positions of the edges of the respective steps S1 to S8 of the step marks MS1 and MS2 are detected. Therefore, it becomes possible to detect the mark OM with accuracy without being affected by the planarization. Hence, it becomes possible to detect the rotation center C1 of the step marks MS1 and MS2 with accuracy, and it is also determined with accuracy whether the difference between the center of gravity thereof and the center of gravity C2 of the resist mark RM fall within the range of reference. Accordingly, reduced is a possibility that the etching may be performed while a significant positional deviation is left occurring between the layers, and as a result, the positional deviation between the layers is reduced. From the above, understood are the effects of the marks OM according to the present embodiment and the method for manufacturing a semiconductor device, the method using the same.

Next, referring to FIGS. 8A to 8C and FIGS. 9A and 9B, a description will be given of a method for forming the step mark MS1 (MS2). FIGS. 8A to 8C and FIGS. 9A and 9B are schematic cross-sectional views explaining the respective steps of the method for forming the step mark MS1. Herein, the case of forming the step mark MS1 on the substrate S as the underlayer is taken as an example. First, as illustrated in FIG. 8A, a resist film RF is formed on the substrate S, and a template TP is thrust against this resist film RF. The template TP has eight steps corresponding to the respective steps S1 to S8 of the step mark MS1. When ultraviolet light is applied to the resist film RF through the template TP thrust against the resist film RF, the resist film RF is cured. Thereafter, as illustrated in FIG. 8B, the template TP is peeled off from the resist film RF. Then, the resist film RF having a patterned staircase-like pattern is obtained. Thereafter, at a lowest step in the patterned resist film RF, a resist that remains by a predetermined remaining film thickness (RLT) on the surface of the substrate S is removed, and the surface of the substrate S is exposed.

Subsequently, as illustrated in FIG. 8C, the patterned resist film RF is used as a mask, and for the substrate S, etching using, for example, plasma is performed. In this etching, the etching proceeds from the exposed surface of the substrate S at (a foot board surface of) the lowest step of the resist film RF. As the etching proceeds, the resist film RF is gradually thinned, and accordingly, as illustrated in FIG. 9A, the surface of the substrate S is sequentially exposed at second, third . . . lowest steps of the resist film RF, and the exposed surface is sequentially etched. The etching is ended when a predetermined time elapses after the surface of the substrate S is exposed at a highest step of the resist film RF and the etching starts from that exposed surface. The respective steps of the resist film RF sequentially disappear, whereby the surface of the substrate S is locally exposed, and the etching proceeds from the exposed surface. Accordingly, a portion exposed for a longer time is etched more deeply. Therefore, as illustrated in FIG. 9B, the staircase-like steps are formed on the substrate S, whereby the step mark MS1 is obtained. Herein, the template TP can have eight steps corresponding to the step mark MS2, whereby the step mark MS2 is also obtained together with the step mark MS1.

Second Embodiment

Next, referring to FIGS. 10A and 10B, a description will be given of a positional deviation detection device according to a second embodiment. FIG. 10A is a top view schematically illustrating a positional deviation detection device 10 according to the present embodiment, and FIG. 10B is a side view schematically illustrating the positional deviation detection device 10. As illustrated in FIGS. 10A and 10B, the positional deviation detection device 10 has a table 10T on which container front opening unified pods 1 to 4

(container FOUP1 to FOUP4) are to be mounted, the container FOUP1 to FOUP4 housing therein substrates such as semiconductor wafers. The container FOUP1 to FOUP4 mounted on the table 10T are hermetically connected to a main body 10M of the positional deviation detection device 10. The inside of the main body 10M is provided with a transfer robot 10R, a support stage 10S, a drive unit 10D, and the sensor CSR.

The transfer robot 10R has an arm 10A having a tip end, for example, provided with a pick. By using this arm 10A, the transfer robot 10R takes out the substrate such as a semiconductor wafer from any of the containers FOUP1 to FOUP4, and delivers the substrate to the support stage 10S. Moreover, the transfer robot 10R receives the substrate from the support stage 10S, and carries the substrate to the original container. The support stage 10S can have, on a surface thereof, a holding mechanism such as an electrostatic chuck that electrostatically supports the substrate, whereby the substrate is surely fixed to the surface of the support stage 10S. Moreover, the support stage 10S can have a support pin (not illustrated) that protrudes and retracts from the surface. Thus, it becomes possible to transfer the substrate between the arm 10A of the transfer robot 10R and the support stage 10S. The drive unit 10D drives the support stage 10S in the vertical direction and the horizontal direction. The drive unit 10D can include, for example, an encoder, whereby it becomes possible to move the support stage 10S and eventually the substrate, which is to be supported by the support stage 10S, with high accuracy and at a high speed. Hence, it becomes possible to acquire the depth information of the above-mentioned step marks MS1 and MS2 surely with accuracy.

A control unit 10C is achievable as a computer including a central processing unit (CPU), a read only memory (ROM), a random access memory (RAM), and the like. Moreover, the control unit 10C may be achieved by hardware including an application-specific integrated circuit (ASIC), a programmable gate array (PGA), and a field programmable gate array (FPGA). The control unit 10C controls the transfer robot 10R, the drive unit 10D, the sensor CSR, and the like in accordance with a predetermined processing program. Specifically, the processing program includes a command group that causes the positional deviation detection device 10 to implement the above-mentioned method for manufacturing a semiconductor device or the above-mentioned positional deviation detection method. That is, the control unit 10C is configured to implement the method for manufacturing a semiconductor device or the positional deviation detection method by controlling the respective units of the positional deviation detection device 10 on the basis of the processing program. Note that the processing program and a variety of data related to this can be downloaded in a wired or wireless manner to the control unit 10C from a non-transitory computer-readable recording medium such as a hard disk drive (HDD), a semiconductor memory, and a server.

In accordance with the positional deviation detection device 10 configured as described above, the above-mentioned method for manufacturing a semiconductor device or the above-mentioned positional deviation detection method can be preferably implemented, and hence, the effects to be exerted by these methods can be exerted by the positional deviation detection device 10.

Modified Example

A description will be given below of modified examples of the mark OM according to the above-mentioned embodiments. FIG. 11A is a top view illustrating an overlay mark according to a first modified example. As illustrated, an overlay mark OM1 (simply referred to as a mark OM1) corresponds to a so-called advanced imaging and measurement (AIM) mark. The mark OM1 illustrated in FIG. 11A has step marks MS1 (MS2) on four corner portions. As illustrated, the step marks MS1 and MS2 adjacent to each other are in a relationship of four-fold symmetry to each other, and the two step marks MS1 (MS2) located on a diagonal line are in a relationship of point symmetry to each other. Hence, depth information on the respective step marks MS1 or MS2 (steps S1 to S8) can be acquired, position information of the edges of the respective steps S1 to S8 can be acquired on the basis of this, and the rotation center can be obtained. The respective steps S1 to S8 descend step by step, and accordingly, are less likely to be affected by the planarization, for example, by the CMP or the like. Hence, also by the mark OM1 according to the modified example, the effects to be exerted by the mark OM according to the embodiments can be exerted. Note that, in the insides of the step marks MS1 and MS2, regions in which the resist marks RM are to be formed are ensured. Herein, four resist marks RM are arranged rotationally symmetrically to one another.

Figure 11B:
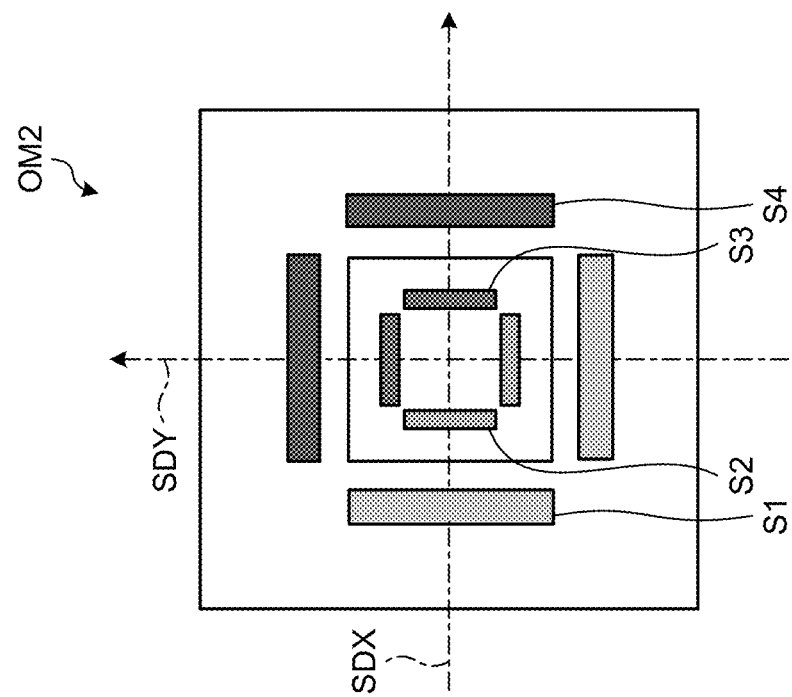
FIGS. 11A and 11B are top views illustrating a modified example of registration marks according to an embodiment according to a first embodiment.
Figure 11A:
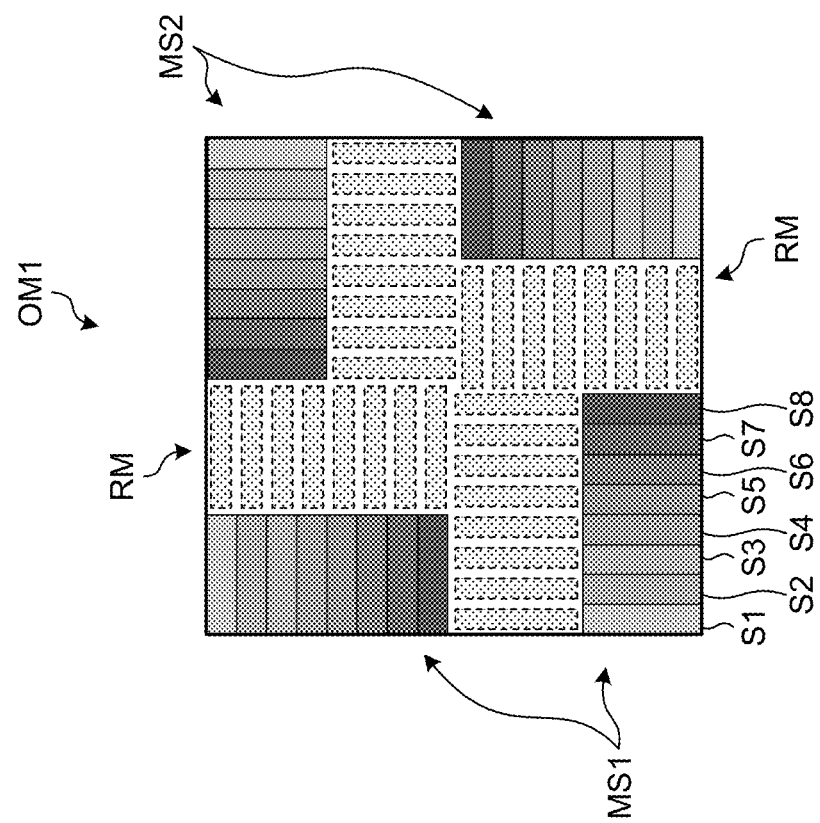

FIG. 11B is a top view illustrating an overlay mark according to a second modified example. As illustrated, an overlay mark OM2 (simply referred to as a mark OM2) corresponds to a so-called bar-in-bar (BIB) mark. In the mark OM2, steps S1, S2, S3, and S4 which descend step by step along an arrow SDX are arranged to form one step mark, and steps S1, S2, S3, and S4 which descend step by step along an arrow SDY are arranged to form another step mark. The steps S1 to S4 are arranged along directions (an SDX direction and an SDY direction) in which the steps S1 to S4 intersect each other, and accordingly, two step marks will be arranged rotationally symmetrically to each other. For example, the laser light (IL) is applied along the arrow SDX, whereby depth information of the steps S1 to S4 is acquired. Moreover, the laser light (IL) is applied along the arrow SDY, whereby depth information of the steps S1 to S4 is acquired. Then, it becomes possible to obtain a rotation center of the two step marks on the basis of the respective pieces of depth information. Specifically, for example, when coordinate systems of reflected light intensity curves of both are rotated by 90° about an arbitrary point, and both of the curves overlap each other, a point concerned can be defined as the rotation center. Also in the mark OM2, the respective steps S1 to S4 descend step by step, and accordingly, are less likely to be affected by the planarization, for example, by the CMP or the like. Hence, also by the mark OM2 according to the modified example, the effects to be exerted by the mark OM according to the embodiments can be exerted.

Other Modified Examples

The mark OM formed on the substrate S has been described as an example; however, in any step of a manufacturing process of a semiconductor device, the mark OM may be formed on an insulating layer or a conductive layer, which is exposed at the time of that step, the insulating layer including a silicon oxide layer, a silicon nitride layer, and the like for example, and the conductive layer including metal, a polycrystalline silicon layer, and the like for example.

Moreover, illustrated is the case where the mark OM is formed on the periphery (the scribe line) of the shot region; however, the mark OM may be formed in the inside of the semiconductor chip region in the shot region. According to this, with regard to device elements, for example, such as vias and memory pillars in the semiconductor chip region, it becomes possible to detect minute positional deviations thereof between the layers.

Moreover, each of the step marks MS1 and MS2 has the eight steps S1 to S8; however, the number of steps is not limited to eight, and may be appropriately determined in accordance with a position at which the mark OM is to be formed, a size of the mark OM formable at that position, a resolution of the sensor CSR for use, and the like.

Further, in the above-mentioned embodiment, the depth information is obtained on the basis of the intensity of the reflected light RL detected by the sensor CSR; however, a time-of-flight (TOF) sensor may be used in place of the sensor CSR. According to this, a time since the laser light is emitted until the laser light is reflected on each of the steps S1 to S8 and returns is converted into a distance, whereby it becomes possible to obtain the depth information without depending on the intensity of the reflected light RL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A positional deviation detection method comprising:
    forming, on a substrate or a layer formed on the substrate, a registration mark including: a first step portion including a plurality of first steps which descend step by step in a first direction from a surface of the substrate or the layer; a second step portion including a plurality of second steps which descend step by step from the surface in a second direction different from the first direction and have a same number as a number of the plurality of first steps, being spaced apart from the first step portion, and being disposed rotationally symmetrically to the first step portion; and a region in which a pattern to be formed of a resist is to be disposed, the region being formed between the first and second step portions spaced apart from each other in a direction of intersecting the first direction and the second direction;
    forming the pattern in the region;
    acquiring first depth information on the plurality of first steps;
    acquiring second depth information on the plurality of second steps;
    obtaining a rotation center of the first step portion and the second step portion based on the first depth information and the second depth information;
    obtaining a center of gravity of the pattern disposed in the region; and
    detecting a deviation between the rotation center and the center of gravity.

2. The positional deviation detection method according to claim 1, wherein
    the first depth information is acquired by irradiating the first step portion with laser light, and
    the second depth information is acquired by irradiating the second step portion with laser light.

3. The positional deviation detection method according to claim 2, wherein
    first position information on each step of the plurality of first steps is acquired based on the first depth information,
    second position information on each step of the plurality of second steps is acquired based on the second depth information, and
    the rotation center of the first step portion and the second step portion is obtained based on the first position information and the second position information.

4. The positional deviation detection method according to claim 3, wherein
    the first depth information and the second depth information are represented by a relationship between a position of a point irradiated with the laser light and a received light intensity of reflected light from the point, and
    the first position information and the second position information are obtained based on the relationship.

5. The positional deviation detection method according to claim 1, wherein
    the first direction and the second direction are opposite to each other, and
    the first step portion and the second step portion are spaced apart from each other in a direction of intersecting the first direction and the second direction.

6. The positional deviation detection method according to claim 1, wherein a region in which a pattern to be formed of a resist is to be disposed is formed between the first step portion and the second step portion which are spaced apart from each other in the intersecting direction.

7. The positional deviation detection method according to claim 1, wherein the registration mark is formed around a shot region in which a semiconductor chip is to be formed.

8. The positional deviation detection method according to claim 1, wherein the registration mark is formed in a shot region in which a semiconductor chip is to be formed.

* * * * *